(12) United States Patent
Burrows

(10) Patent No.: US 6,770,132 B1
(45) Date of Patent: Aug. 3, 2004

(54) METHOD FOR PRESSURIZED ANNEALING OF LITHIUM NIOBATE AND RESULTING LITHIUM NIOBATE STRUCTURES

(75) Inventor: Lee J. Burrows, San Francisco, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/309,361

(22) Filed: May 11, 1999

Related U.S. Application Data

(60) Provisional application No. 60/084,940, filed on May 11, 1998.

(51) Int. Cl.[7] .............................................. C30B 28/02
(52) U.S. Cl. ............................... 117/7; 117/13; 117/34; 117/213; 117/948
(58) Field of Search .................. 117/7, 13, 34, 117/19, 84, 213, 33, 910, 948; 501/134

(56) References Cited

U.S. PATENT DOCUMENTS

| | | | |
|---|---|---|---|
| 4,196,963 A | * 4/1980 | Chen et al. | 350/96.12 |
| 4,396,246 A | * 8/1983 | Holman | 350/96.14 |
| 4,640,736 A | 2/1987 | Holman | 427/164 |
| 5,064,684 A | 11/1991 | Mir et al. | 427/53.1 |
| 5,095,518 A | * 3/1992 | Young et al. | 385/130 |
| 5,193,136 A | 3/1993 | Chang et al. | 385/129 |
| 5,442,719 A | * 8/1995 | Chang et al. | 385/14 |
| 5,714,198 A | * 2/1998 | Byer et al. | 427/163.2 |
| 5,902,519 A | * 5/1999 | Stoll | 252/584 |
| 5,904,912 A | * 5/1999 | Kitamura et al. | 423/594 |

FOREIGN PATENT DOCUMENTS

| | | | |
|---|---|---|---|
| EP | 0 635 735 | 6/1994 | ............ G02B/6/12 |
| EP | 0 652 457 | 9/1994 | ............ G02F/1/035 |
| EP | 0 669 546 | 2/1995 | ............ G02F/1/035 |
| JP | 04249215 A | * 9/1992 | |
| JP | 07120798 | 12/1995 | ............. G02F/1/37 |
| WO | WO99/63393 | 12/1999 | |

OTHER PUBLICATIONS

Nagata, et al. "Reduced thermal decomposition of OH–free $LiNbO_3$ substrates even in a dry gas atmosphere," Journal of Materials Research, Aug. 1996, Mater. Res. Soc., USA, vol. 11, No. 8, pp. 2085–2091.

Kwiatkowski, et al. "Nearly cut–off modes caused by diffusion in lithium niobate," Journal of Applied Physics, vol. 76, No. 10, pt. 1, pp. 5877–5885, Nov. 15, 1994.

Nozawa, et al. "Water Vapor Effects on Titanium Diffusion into $LiNbO_3$ Substrates," Japanese Journal of Applied Physics, vol. 29, No. 10, pp. 2180–2185, Oct. 1, 1990.

* cited by examiner

*Primary Examiner*—Lan Vinh
(74) *Attorney, Agent, or Firm*—Thelen Reid & Priest, LLP; David B. Ritchie

(57) ABSTRACT

In one aspect of the invention, a method for pressurized annealing of lithium niobate or lithium tantalate structures, such as optical modulators and optical wave guides, comprises pressurizing an oxygen atmosphere containing a lithium niobate or lithium tantalate structure above normal atmospheric pressure, heating the structure to a temperature ranging from about 150 degrees Celsius to about 1000 degrees Celsius, maintaining pressure and temperature to effect ion exchange or to relieve stress, and cooling the structure to an ambient temperature at an appropriate ramp down rate.

54 Claims, 3 Drawing Sheets

METHOD FOR PRESSURIZED ANNEALING OF LITHIUM NIOBATE AND RESULTING LITHIUM NIOBATE STRUCTURES

REFERENCE TO RELATED PROVISIONAL PATENT APPLICATION

This application claims the benefit of U.S. Provisional Patent Application Serial No. 60/084,940, filed May 11, 1998, and entitled "Pressurized Annealing of Lithium Niobate," the entirety of which is hereby incorporated herein by reference as if set forth in full herein.

STATEMENT AS TO RIGHTS TO INVENTION

The United States Government has certain rights in this invention pursuant to Grant No. F-19628-95-C-0002 awarded by the United States Air Force.

BACKGROUND OF THE INVENTION

1. Field of the Invention

The present invention relates to a method for annealing lithium niobate and fabrication processes involving the annealing of lithium niobate devices. More particularly, the present invention relates to a method for annealing in a pressurized oxygen gas atmosphere bulk lithium niobate and optical waveguides and modulators having lithium niobate substrates.

2. Background

Optoelectronic components can be fabricated on several types of substrates including polymers, glass, semiconductors (i.e., gallium arsenide (GaAs) and indium phosphide (InP)) and inorganic materials (i.e., lithium niobate ($LiNbO_3$) and lithium tantalate ($LiTaO_3$)). Characteristically, an electro-optic material is one in which the index of refraction changes with the application of an electric field. One of the most important components in optoelectronic systems is the modulator. Three competing technologies in this realm are: direct modulation of a semiconductor laser, semiconductor electro-absorption modulators, and the lithium niobate modulator. Currently, lithium niobate modulators are the modulation devices of choice for many systems because they yield high performance, are a relatively mature technology and other modulation schemes impose limits not faced with lithium niobate modulators.

Lithium niobate has proven to be a suitable medium for components such as amplitude modulators, phase modulators, optical switches, polarization transformers, tunable filters and wavelength-selective optical add/drop filters. Lithium niobate has also been used as the host for solid state lasers using rare earth ions, e.g., erbium. Most current telecommunication and cable television system applications for $LiNbO_3$ modulators involve discrete components for the optical transmitter subsystem. This configuration couples continuous wave lasers, typically diode-pumped YAG or erbium fiber oscillators, with lithium niobate external modulators and various wavelength and power stabilization components.

Lithium niobate is a popular nonlinear optical crystal for several reasons including its large electro-optic coefficients, the ease with which high quality optical waveguides are fabricated and its amenability to conventional integrated circuit processing techniques. High quality optical waveguides are those that possess low loss and high power handling capabilities. Additionally, $LiNbO_3$ is a hard material, thus easily polished for fiber coupling which makes its use in optical network systems relatively uncomplicated. It is also a relatively inexpensive crystal, due in part to its long history of use in surface-acoustic-wave (SAW) filters for radio frequencies. By comparison, lithium tantalate $LiTaO_3$ is essentially interchangeable with lithium niobate as far as modulator characteristics are concerned, but the use of $LiTaO_3$ is often cost prohibitive because it is not as widely commercially used.

For example, one type of modulator incorporating the use of $LiNbO_3$ is a Mach-Zehnder modulator. In a Mach-Zehnder modulator an incoming optical beam is split equally at a Y junction into two parallel waveguides, which then recombine at another Y junction after some distance. Electrodes are used to apply an electric field in the region of the optical waveguides. The electric field causes a relative phase shift between the two branches. If the phase shift in both arms is the same, then the two optical signals will recombine constructively at the second Y branch and no optical power will be lost. If there is a phase difference between the two arms, then there will be destructive interference and some optical power will be lost. The resulting destructive and constructive interference causes the output optical intensity to vary between a minimum and a maximum value.

In other electro-optic applications optical waveguide directional couplers can also be used as electro-optic modulators. In this type of modulator two waveguides are placed on the lithium niobate substrate in very close proximity to one another. The wave from one guide can "leak" into the other guide. By applying an electric field to the lithium niobate, the amount of "leakage" can be controlled, thus modulating the transfer of power from one guide to the other. Currently, different commercial application requirements favor either directional couplers or Mach-Zehnder modulators.

High-speed communications has led to a demand for the external modulator configuration. The most common approach utilizes a low-noise, high power diode-pumped laser whose signal is sent to the $LiNbO_3$ modulator via optical fiber. The modulator applies either analog or digital information to the optical carrier.

When using lithium niobate in the fabrication of optical waveguides and optical modulators it is desired to avoid having a niobium-rich, lithium-poor and/or oxygen poor composition. When bulk lithium niobate has such niobium rich-compositions, and is then processed at high temperatures (T>300 degrees Celsius), growth of the $LiNb_3O_8$ phase in the crystal may occur. This phase is undesirable because it is not optically transparent and leads to high losses in optical waveguides and optical modulators.

Such niobium-rich compositions can occur in two different manners during fabrication of optical waveguides and optical modulators. First, typical ion exchange procedures result in the replacement of lithium atoms in the crystal lattice with a diffusing ion leading to a lithium niobate composition relatively rich in niobium. Second, standard high temperature (temperatures in excess of 300 degrees Celsius) processing of lithium niobate can cause $Li_2O$ out-diffusion, and result in niobium-rich, and lithium and oxygen poor compositions.

To eliminate the undesired $LiNb_3O_8$ phase from forming in the crystal, high temperature processing, such as the stress relieving anneal process, is usually performed in a wet atmosphere of inert carrier gas, such as nitrogen ($N_2$) or argon ($Ar_2$), or in a wet atmosphere of oxygen ($O_2$). This type of anneal process involves bubbling the inert carrier gas or oxygen gas through water ($H_2O$). The wet atmosphere is beneficial because the $H_2O$ attacks the $LiNb_3O_8$ phase and breaks it down into $LiNbO_3$. A typical wet atmosphere anneal operation is performed at a temperature of about 350 degrees Celsius for a period of 5 to 6 hours in a wet, flowing environment. The present inventor has discovered that a drawback of this type of high temperature processing is that the $H_2O$ gives off undesirable protons which are attracted by the lithium niobate and result in an inadvertent proton exchanged surface layer occurring. These protons remain in the modulators after fabrication and flow relatively freely among the waveguides, the waveguides and the electrodes and in the lithium niobate crystal and the buffer layer interface. Undesirable free flowing protons can adversely affect a modulator's DC-bias stability because they act as charge carriers and are driven by the applied electric fields, causing the response of the final product to drift over time when a bias is applied.

Additionally, high temperature processing (>300 degrees Celsius) leads to oxygen out-diffusion of lithium niobate structures. This out-diffusion tends to form a surface layer on a lithium niobate substrate or a lithium niobate waveguide that is oxygen poor in composition. This oxygen poor region acts as a surface optical waveguide and causes undesirable leakage of light out of the lithium niobate substrate.

It is therefore highly advantageous to devise a new high temperature annealing process that inhibits the formation of the undesirable $LiNb_3O_8$ phase in the crystal and outdiffusion of $O_2$ without the process introducing significant numbers of free flowing protons that will affect the modulator's DC-bias stability.

BRIEF DESCRIPTION OF THE INVENTION

In one aspect of the invention, a method for pressurized annealing of lithium niobate or lithium tantalate structures, such as optical modulators and optical wave guides, comprises pressurizing an oxygen atmosphere containing a lithium niobate or lithium tantalate structure above normal atmospheric pressure, heating the structure to a temperature ranging from about 150 degrees Celsius to about 1000 degrees Celsius, maintaining pressure and temperature to effect ion exchange or to relieve stress, and cooling the structure to an ambient temperature at an appropriate ramp down rate.

In another aspect of the invention a lithium niobate structure such as an optical waveguide or an optical modulator comprises an optically transparent portion that is substantially void of free protons.

DETAILED DESCRIPTION OF THE PRESENT INVENTION

Those of ordinary skill in the art will realize that the following description of the present invention is illustrative only and is not intended to be in any way limiting. Other embodiments of the invention will readily suggest themselves to such skilled persons from an examination of the within disclosure.

In accordance with a presently preferred embodiment of the present invention, a method for pressurized annealing of lithium niobate is disclosed as follows. A lithium niobate ($LiNbO_3$) structure is heated and pressurized in an oxygen gas atmosphere for the necessary time period required to provide stress relief or ion exchange in accordance with the desired benefit of the specific annealing process.

The present invention may also be defined as a method for pressurized annealing of lithium tantalate ($LiTaO_3$). Lithium tantalate is closely related in terms of electro-optical properties to $LiNbO_3$ but is not currently widely used in commercial electro-optical modulator applications because to do so would be cost prohibitive. The same or similar anneal process as described below for $LiNbO_3$ would be employed in the annealing of $LiTaO_3$.

Prior to the anneal process the lithium niobate structure may be placed in a container that allows for lithium niobate powder to be placed in close proximity to the lithium niobate structure. Within the container the lithium niobate structure and the lithium niobate powder are isolated by a porous interface that allows gas to flow between the lithium niobate structure and the lithium niobate powder but does not allow for the lithium niobate powder to contaminate the lithium niobate structure. The container is closed by slip fit caps that allow for oxygen gas to enter into the container when a pressure differential exists yet restricts the outward flow of lithium oxide ($Li_2O$) in the absence of a pressure differential. The purpose of the lithium niobate powder is to induce lithium oxide ($Li_2O$) outgassing in the lithium powder during the anneal process while retarding the same outgassing in the lithium niobate structure. As previously discussed lithium niobate will outgas $Li_2O$ when exposed to temperatures in excess of 300 degrees Celsius. The outgassing leads to a lithium niobate structure that is poor in lithium. Lithium poor structures are prone to the $LiNb_3O_8$ phase forming in the crystal. The $LiNb_3O_8$ phase is not optically transparent and affects high losses in the waveguides. The lithium niobate powder has a larger surface area and is generally more reactive than the lithium niobate structure; therefore outgassing will occur more readily in the lithium niobate powder. Once the anneal environment is saturated with $Li_2O$ outgassed from the powder, the lithium niobate structure is less likely to initiate or further outgas.

Figure 1A:
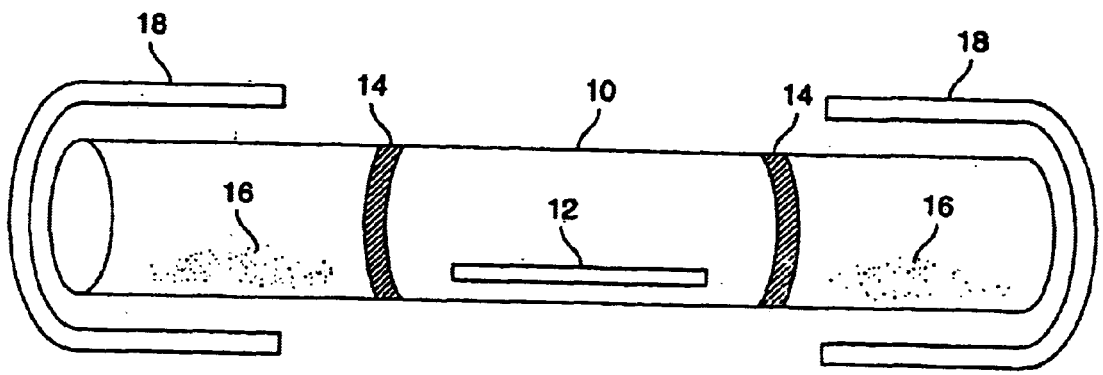
FIG. 1A is a cross-sectional view of a container used for annealing lithium niobate structures in an environment having lithium niobate powder in accordance with a present preferred embodiment of the present invention.

Shown in FIG. 1A is a cross-sectional illustration of such an annealing container having both a lithium niobate structure and lithium niobate powder contained within. This illustration is shown by way of example, other containers that meet this intent and purpose are also feasible and within the inventive intent herein disclosed. The sealable container 10 is a tube-like structure that may be fabricated from a high temperature ceramic material such as aluminum oxide. The lithium niobate structure 12 is placed in the center region of the tube and two porous plugs 14 are positioned within the tube a short distance from the tube endings. The porous plugs 14 may comprise any high-temperature material such as aluminum oxide ($Al_2O_3$) or a similar material. By way of example, the porosity of porous plugs 14 may be defined by the material having holes on the magnitude of about 20 microns. Plugs 14 allow for the free flow of $O_2$ and $Li_2O$ between the chamber housing the $LiNbO_3$ crystal and the chamber(s) housing the lithium niobate powder. Once the plugs 14 are positioned within the container 10, lithium niobate powder 16 is placed in one end or both ends of the plugged container 10. The amount of lithium niobate powder used will be dependant on the internal area of the sealable container. By way of example, the amount of the lithium niobate powder may be 2.5 grams for a tube having an area of about 1.0 in$^3$ to about 2.0 in$^3$. Once the lithium niobate powder 16 has been properly positioned in the tube, the tube is capped at both ends with loose slip fit caps 18 that are typically formed from the same high temperature material as container 10. Slip fit caps 18 will allow oxygen gas to enter container 10 when a pressure differential exists yet restrict the outward flow of Li$_2$O during the anneal process.

Figure 1B:
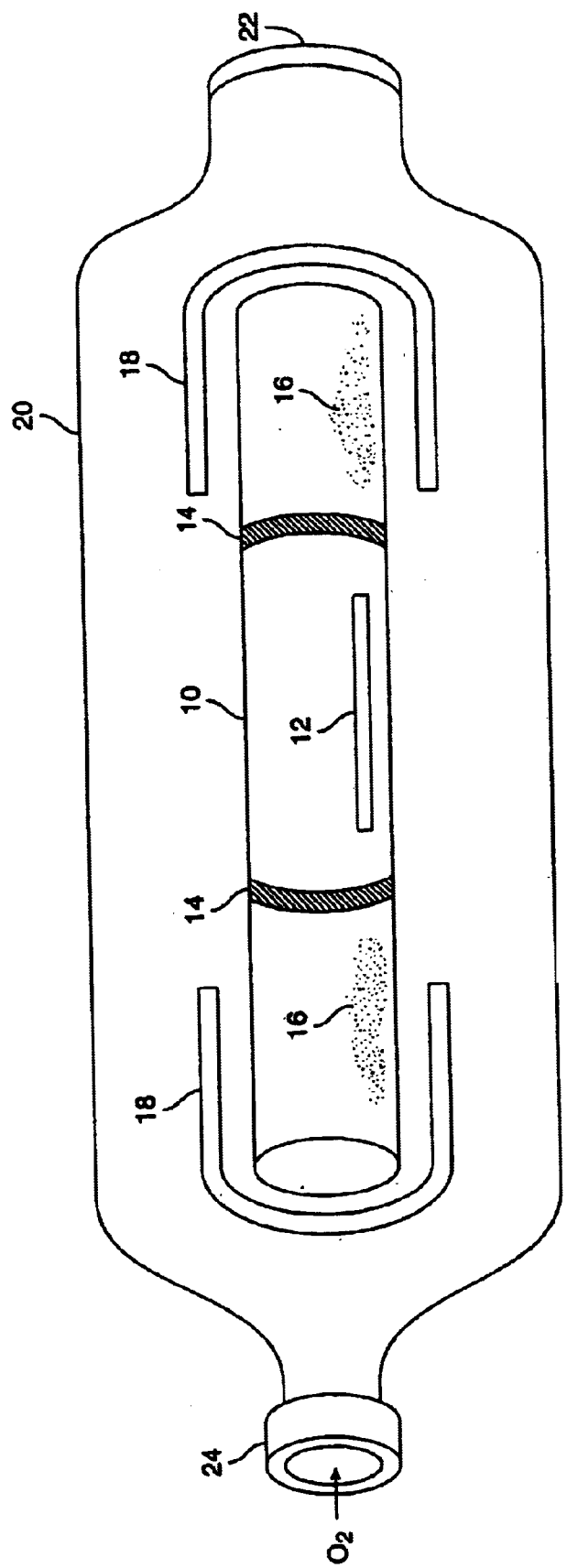
FIG. 1B is a cross-sectional view of a pressurizable vessel used for annealing lithium niobate in accordance with a presently preferred embodiment of the present invention.

Once the container of FIG. 1 is properly assembled it can be placed within a sealable and pressurizable vessel. A cross-sectional view of such a vessel is shown in FIG. 1B, enclosing the container 10 of FIG. 1A. The pressurizable vessel 20 is typically formed from a metal material such as stainless steel. In this illustration vessel 20 is tube-like in structure and has fittings 22 and 24 at opposite ends of vessel 20. Fitting 22 is a fixed fitting and fitting 24 allows for vessel 20 to be vacuum pumped and pressurized with oxygen gas.

Additionally, annealing with lithium niobate powder can be undertaken without the use of the container, such as the one shown in FIG. 1A. It is also possible and within the inventive concept herein disclosed to place the lithium niobate powder directly in pressurized vessel 20. However, the quantity of required lithium niobate powder increases substantially when the powder is placed directly inside the pressurized vessel, making this alternate embodiment, in most instances, cost prohibitive.

The anneal process begins by placing the LiNbO$_3$ crystal structure in a conventional annealing oven. Any suitable oven can be used as the annealing chamber and the use of such ovens are widely known by those of ordinary skill in the art. It is possible to use an anneal oven that has pressurizing capabilities in which case the use of the separate pressurizable vessel of FIG. 1B would be unnecessary. Upon placing the lithium niobate structure into the oven, the oven or pressurizable vessel is sealed and then the oven or pressurizable vessel is vacuum pumped down to approximately 100 microns pressure or less to eliminate contaminants from the annealing environment. The vacuum pump down procedure is optional and in some instances the need to remove contaminants from the annealing environment may not be of concern. Once the oven or pressurizable vessel has been sealed and vacuumed it is then pressurized with oxygen gas (O$_2$). The pressurized oxygen atmosphere serves to prevent oxygen outgassing. It should be noted that the atmosphere is a pure oxygen gas environment, no H$_2$O is present and thus no free protons or other radicals are given off that would adversely affect the LiNbO$_3$. The pressure in the O$_2$ atmosphere may be raised to a value in the range of just above ambient atmospheric pressure to about 250 psi above ambient atmospheric pressure. An optimal anneal pressure range is from about 2 psi to about 25 psi above ambient atmospheric pressure, preferably about 6 psi above ambient atmospheric pressure. Applications have shown that annealing at pressures above 25 psi tends to cause the LiNbO$_3$ to turn green in color. While the green discoloration does not appear to affect the structure negatively, to avoid this discoloration pressures below 25 psi above ambient atmospheric pressure should be used.

Once the oxygen pressurization has been implemented in the anneal chamber the temperature in the oven is then raised to the appropriate level that affects the necessary degree of ion exchange or stress relief desired. In general, the temperature can be raised to a value in the range of about 150 degrees Celsius to about 1000 degrees Celsius. A temperature of about 300 degrees Celsius will generally allow for the necessary stress relief to occur in the lithium niobate structure. Temperatures above 1000 degrees Celsius are generally undesirable because they allow for further undesirable phase changes to occur in the LiNbO$_3$ crystal. A presently preferred anneal temperature is about 300 degrees Celsius. It is generally advisable to anneal at lower temperatures to assure proper stress relief and control the depth of ion exchange. The ramp up rate for elevating the temperature in the oven may be in the range of about 0.5 degrees Celsius per minute to about 12.0 degrees Celsius per minute. The preferred ramp up rate is 1.0 degrees Celsius per minute.

The required duration of the anneal process will depend upon the temperature at which the annealing takes place. For a higher temperature anneal process a shorter anneal period is required and for a lower temperature anneal process a longer anneal period is required. The anneal period is measured from the time at which the desired elevated temperature is reached. In general, the anneal process will last from about 4 hours to about 8 hours. Longer anneal times are possible but are not commercially acceptable. Shorter anneal times are possible but will require higher anneal temperatures. The desired elevated temperature and elevated pressure should be maintained throughout the duration of the anneal process. Preferably the anneal process will last approximately 6 hours.

The anneal process is completed by cooling the lithium niobate structure in a slow manner. The ramp down rate for the crystal structure may be from about 0.5 degrees Celsius per minute to about 40 degrees Celsius per minute. A presently preferred ramp down rate for the crystal structure is 1.0 degrees Celsius per minute.

Figure 2A:
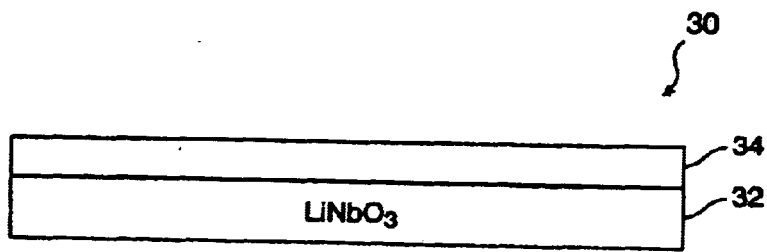
FIGS. 2A–2G are cross-sectional views of various stages in the fabrication of a lithium niobate ion exchange optical modulator that incorporates pressurized oxygen atmosphere annealing in accordance with a presently preferred embodiment of the present invention.

In another presently preferred embodiment of the present invention a method for fabricating a ion exchange lithium niobate optical waveguide, and the accompanying optical modulator, using the above described annealing process is detailed as follows. Other lithium niobate optical waveguides and modulators can also be fabricated, such as titanium indiffusion waveguides and modulators. Therefore, the use of the pressurized anneal process is not limited to the fabrication of ion exchange lithium niobate optical waveguides and modulators. The following description of the modulator fabrication process, which is by way of example, is intended to limit the introduction of undesirable free protons into the fabrication process. FIGS. 2A–2G are cross sectional views of a modulator after completion of selected steps in the fabrication process. Referring to FIG. 2A, a modulator build 30 is shown after the formation of a mask layer 34 over the LiNbO$_3$ crystal substrate 32. The mask layer 34 may comprise silicon oxide (SiO$_2$), chromium oxide (Cr$_2$O$_3$), aluminum oxide (Al$_2$O$_3$) or another suitable masking layer material. Preferably, the mask material should be robust enough to withstand exposure to acids conceivably introduced in later processing. The use of such masking layer materials are well known by those of ordinary skill in the art. Mask layer 34 may be formed by using conventional plasma deposition, sputtering or thermal evaporation techniques, all of which are well known by those of ordinary skill in the art.

Figure 2B:
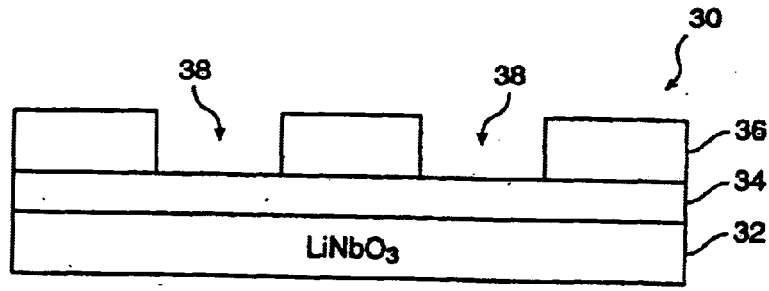

In FIG. 2B, standard photolithography techniques are used to place a photo resist layer 36 over the mask layer 34. As shown in FIG. 2B the photolithography process will result in the formation of lines of photo resist only in those areas where waveguides are to be fabricated and the formation of vias 38 leading to mask layer 34. The use of such photolithography techniques are well known by those of ordinary skill in the art.

Figure 2C:
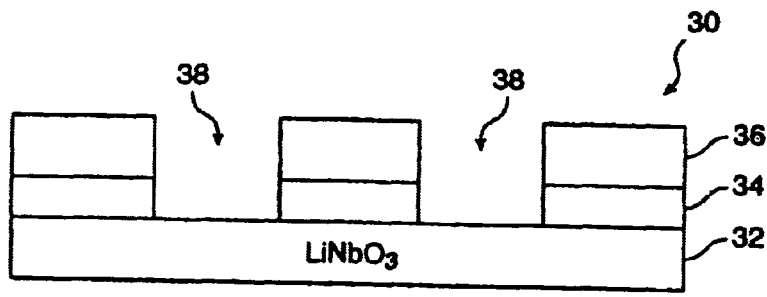

Referring to FIG. 2C a known plasma etch or reactive ion etch (RIE) technique is then employed to form vias 38 through the mask layer 34. A plasma etch or RIE procedure is chosen so that it selectively etches away the material chosen as mask layer 34. It should be noted that the etch process should not involve wet etching. Wet etching involves the use of acids and thus would introduce free protons into the waveguide scheme that would adversely affect the $LiNbO_3$. As previously discussed free protons in the waveguide tend to increase the likelihood of output voltage drift over time.

Once the plasma etch or RIE process is completed it may be desirable to strip away residual photoresist. However, in some instances the photoresist will be robust enough to withstand exposure to acidic materials and thus no stripping process needs to be employed. If an optionally stripping process is employed it can be accomplished with an oxygen plasma or by using an acetone wash. The use of acids for stripping purposes should be avoided as they have a tendency to introduce free protons into the modulator construct and these free protons increase the likelihood of latent drift in the modulators.

Figure 2D:
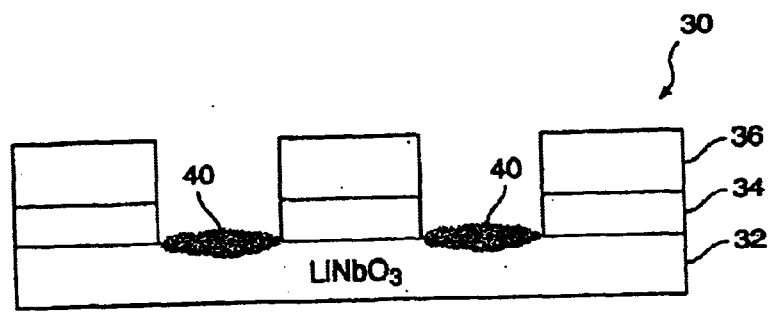

Referring to FIG. 2D, shown is the modulator build 30 after undergoing initial ion exchange diffusion. The exposed $LiNbO_3$ crystal substrate 32 is treated with an acid. The acid may be benzoic acid ($C_7H_6O_2$), sulfuric acid ($H_2SO_4$) or another suitable acid. The first initial diffusion occurs with ions replacing up to 50% of the lithium atoms in the initial exchange region 40. The initial ion exchange region 40 is typically about 0.4 microns in depth. The initial diffusion can be accomplished by immersing the modulator build 30 in a vented chamber having the appropriate acid at the desired temperature. In general the diffusion chamber will have the acid held at a temperature between about 160 degrees Celsius and about 200 degrees Celsius. The diffusion soak time will last from about 5 minutes to about 30 minutes. The temperature and time of the initial diffusion process will be dependant upon the acid used and the ability to achieve about 50% lithium exchange to a depth of about 4 microns in $LiNbO_3$ crystal substrate 32. Following the diffusion soak, modulator build 30 is washed with a suitable solvent such as propenyl or acetone to remove the residual acid.

Once the initial diffusion process is completed the photoresist layer 36 and the mask layer 34 may be removed by subjecting modulator build 30 to a suitable stripping procedure. This process can be accomplished after the initial diffusion step or it can be accomplished after the secondary pressurized anneal process. If an optional stripping process is employed at this stage in the fabrication it can be accomplished with an oxygen plasma or by using an acetone wash. The use of acids for stripping purposes should be avoided as they have a tendency to introduce free protons into the waveguide construct and these free protons increase the likelihood of latent drift in the waveguide.

Figure 2E:
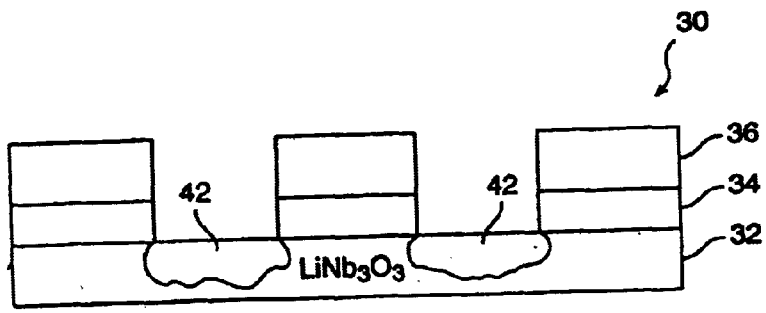

Following the initial diffusion process the waveguide undergoes a pressurized anneal process that serves to further diffuse the ion exchange and drive the exchange into greater depths within $LiNbO_3$ crystal substrate 32. This anneal process is referred to as the secondary anneal process because it is in addition to the primary pressurized anneal operation that is completed after the waveguides and electrodes have been constructed. This pressurized anneal process has been discussed in detail above. The preferred anneal temperature is about 300 degrees Celsius. The preferred anneal atmosphere is oxygen ($O_2$) at about 6 psi above ambient atmospheric pressure. The preferred anneal time is about 4 hours to about 6 hours. The anneal process may incorporate the use of powdered lithium niobate to lessen the likelihood of modulator build 30 outgassing $Li_2O$. The secondary anneal process is used to diffuse the ions further into $LiNbO_3$ crystal substrate 32. As shown in FIG. 2E, the resulting secondary anneal process will result in the ions having a ion exchange region 42 with a penetration depth of about 6 microns and less than or equal to about 12% of the lithium atoms in ion exchange region 42 will have been replaced with ions.

Figure 2F:
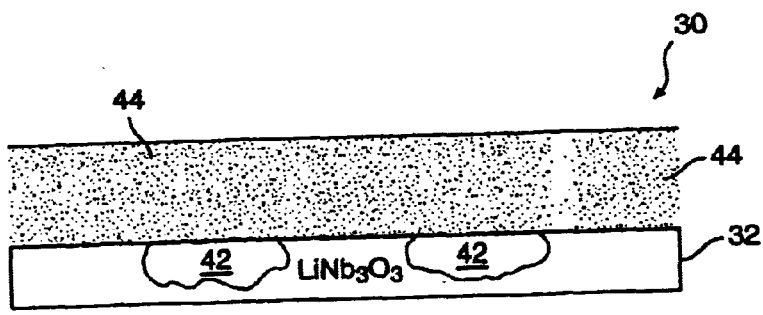

As shown in FIG. 2F, once the secondary anneal process is completed a buffer layer 44 is placed over the entire modulator build 30. Buffer layer 44 serves as insulation and is generally about 2000 to about 3000 angstroms in thickness, preferably about 3000 angstroms. Buffer layer 44 may comprise silicon oxide ($SiO_2$), silicon nitride ($Si_3N_4$ or other phases), a combination of silicon oxide and silicon nitride, indium tin oxide (ITO) or another suitable insulator material. Prior to placing buffer layer 44 over the waveguides and the crystal substrate a strip operation is employed to remove the waveguide template. The strip operation can be accomplished using an oxygen plasma, an acetone wash, PVD etch or another suitable technique that does not introduce the use of acids into the fabrication process. A conventional deposition technique, such as sputtering may be used to place buffer layer 44 over modulator build 30. It should be noted that the use chemical vapor deposition (CVD) techniques should be avoided as such processing generates undesirable free protons.

Figure 2G:
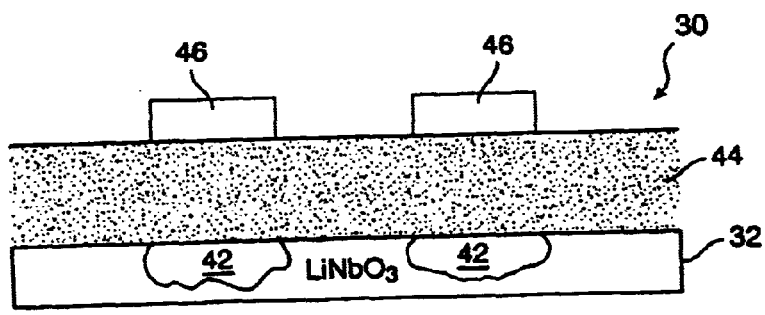

Referring to FIG. 2G, the modulator build 30 is completed by placing electrodes 46 above the buffer layer 44. As shown, electrodes 46 can be placed directly above waveguide vias 38 or they may be placed at other locations atop buffer layer 44. As is known by those of ordinary skill in the art, Z orientation modulators will have electrodes formed directly above the waveguides and X or Y orientation modulators will have electrodes formed offset from the waveguides. Standard deposition techniques are used to form electrodes 46 above buffer layer 44. A standard deposition technique may include a photoresist process, a conventional plasma deposition, sputtering or thermal evaporation process, a plasma etch process and a strip and acetone or propenyl wash process to eliminate the photoresist. The electrodes may be formed from gold (Au), chromium gold, titanium and gold or other suitable electrode materials. The use of chromium and titanium in combination with gold or as a pure thin layer between buffer layer 44 and electrode 46 is for the purpose of increasing adhesion between the gold and the buffer layer.

Once the electrodes have been fabricated the modulator build 30 undergoes a post build anneal process to relieve stress in the lithium niobate crystal, the electrodes and/or the buffer layer. In some instances, this anneal step may also be performed after the formation of buffer layer 44. This pressurized anneal process is referred to as the primary anneal process that all modulator builds undertake as part of standard modulator fabrication. Lithium niobate has inherently high stress coefficients and relieving stress is essential to assure that output drift does not occur in the modulators. This pressurized anneal process has been discussed in detail above. The preferred anneal temperature is about 300 degrees Celsius. The preferred anneal atmosphere is oxygen ($O_2$) at about 6 psi above ambient atmospheric pressure. The preferred anneal time is about 4 hours to about 6 hours. The anneal process may incorporate the use of powdered lithium niobate to lessen the likelihood of modulator build 30 outgassing $Li_2O$.

Alternative Embodiments

Although illustrative presently preferred embodiments and applications of this invention are shown and described herein, many variations and modifications are possible which remain within the concept, scope and spirit of the invention, and these variations would become clear to those skilled in the art after perusal of this application. The invention, therefore, is not limited except in spirit of the appended claims.

What is claimed is:

1. A method for annealing a lithium niobate ($LiNbO_3$) structure, the method comprising:
   heating the lithium niobate structure in a sealed oxygen gas ($O_2$) atmosphere substantially lacking in $H_2O$, without introducing substantial quantities of undesirable free protons into the lithium niobate structure;
   pressurizing the sealed oxygen gas atmosphere to exceed ambient atmospheric pressure;
   maintaining temperature and pressure for an anneal period; and
   cooling to room temperature.

2. The method of claim 1 wherein said pressurizing is within a pressure range of about 2 psi above ambient atmospheric pressure to about 25 psi above ambient atmospheric pressure.

3. The method of claim 1 wherein said cooling occurs within a range of rates of about 0.5 degrees Celsius per minute to about 40 degrees Celsius per minute.

4. The method of claim 1 wherein said heating occurs at a rate within the range of about 0.5 degrees Celsius per minute to about 12.0 degrees per minute.

5. The method of claim 1 wherein the lithium niobate structure includes at least one of an optical modulator and an optical waveguide.

6. The method of claim 1 wherein the sealed oxygen gas atmosphere is a pure oxygen gas atmosphere.

7. The method of claim 1 wherein said heating comprises:
   locating a lithium niobate powder proximate to the lithium niobate structure to retard outgassing of lithium oxide ($Li_2O$) from the lithium niobate structure.

8. The method of claim 7 wherein said heating further comprises:
   separating the lithium niobate powder from the lithium niobate structure with an interface porous to lithium oxide gas outgassed from the lithium niobate powder and the interface substantially without porosity to the lithium niobate powder.

9. The method of claim 8 wherein the interface includes a porosity of approximately 20 microns.

10. The method of claim 1 wherein said heating is within a temperature range of about 150 degrees Celsius to about 900 degrees Celsius.

11. The method of claim 10 wherein said heating is within a temperature range of about 150 degrees Celsius to about 600 degrees Celsius.

12. The method of claim 11 wherein said heating is within a temperature range of about 300 degrees Celsius to about 400 degrees Celsius.

13. A method for annealing a lithium niobate ($LiNbO_3$) structure, the method comprising:
   locating a lithium niobate powder in a space proximate to the lithium niobate structure to retard outgassing of lithium oxide ($Li_2O$) from the lithium niobate structure;
   separating the space including the lithium niobate powder from the lithium niobate structure with an interface porous to lithium oxide gas outgassed from the lithium niobate powder, the interface being substantially without porosity to the lithium niobate powder;
   heating the lithium niobate structure and the lithium niobate powder in a sealed oxygen gas ($O_2$) atmosphere;
   pressurizing the sealed oxygen gas atmosphere to a pressure above ambient atmospheric pressure;
   maintaining temperature and pressure for an anneal period; and
   cooling to room temperature.

14. The method of claim 13 wherein the interface includes a porosity of approximately 20 microns.

15. The method of claim 13 wherein the sealed oxygen gas atmosphere substantially lacks in $H_2O$.

16. The method of claim 13 wherein said cooling occurs within a range of rates of about 0.5 degrees Celsius per minute to about 40 degrees Celsius per minute.

17. The method of claim 13 wherein said heating occurs at a rate within the range of about 0.5 degrees Celsius per minute to about 12.0 degrees per minute.

18. The method of claim 13 wherein said pressurizing is within a pressure range of about 2 psi above ambient atmospheric pressure to about 25 psi above ambient atmospheric, pressure.

19. The method of claim 13 wherein the lithium niobate structure includes at least one of an optical modulator and an optical waveguide.

20. The method of claim 13 wherein the sealed oxygen gas atmosphere is a pure oxygen gas atmosphere.

21. The method of claim 13 wherein said heating is within a temperature range of about 150 degrees Celsius to about 900 degrees Celsius.

22. The method of claim 21 wherein said heating is within a temperature range of about 150 degrees Celsius to about 600 degrees Celsius.

23. The method of claim 22 wherein said heating is within a temperature range of about 300 degrees Celsius to about 400 degrees Celsius.

24. A method for annealing a lithium tantalate ($LiTaO_3$) structure, the method comprising:
   heating a lithium tantalate structure in a sealed oxygen gas ($O_2$) atmosphere substantially lacking in $H_2O$, without introducing substantial quantities of undesirable free protons into the lithium tantalate structure;
   pressurizing the sealed oxygen gas atmosphere to exceed ambient atmospheric pressure;
   maintaining temperature and pressure for an anneal period; and
   cooling to room temperature.

25. The method of claim 24 wherein said heating further comprises:
   locating a lithium tantalate powder proximate to the lithium tantalate structure to retard outgassing of lithium oxide ($Li_2O$) from the lithium tantalate structure.

26. The method of claim 24 wherein said cooling occurs within a range of rates of about 0.5 degrees Celsius per minute to about 40 degrees Celsius per minute.

27. The method of claim 24 wherein the pressurizing is within a pressure range of about 2 psi above ambient atmospheric pressure to about 25 psi above ambient atmospheric pressure.

28. The method of claim 24 wherein the heating occurs at a rate within the range of about 0.5 degrees Celsius per minute to about 12.0 degrees per minute.

29. The method of claim 24 wherein, wherein the lithium tantalate structure includes at least one of an optical modulator and an optical waveguide.

30. The method of claim 24 wherein the sealed oxygen gas atmosphere is a pure oxygen gas atmosphere.

31. The method of claim 25 wherein said heating further comprises:
separating the lithium tantalate powder from the lithium tantalate structure with an interface porous to lithium oxide gas outgassed from the lithium tantalate powder and the interface substantially without porosity to the lithium tantalate powder.

32. The method of claim 31 wherein the interface includes a porosity of approximately 20 microns.

33. The method of claim 24 wherein said heating is within a temperature range of about 150 degrees Celsius to about 900 degrees Celsius.

34. The method of claim 33 wherein said heating is within a temperature range of about 150 degrees Celsius to about 600 degrees Celsius.

35. The method of claim 34 wherein said heating is within a temperature range of about 300 degrees Celsius to about 400 degrees Celsius.

36. A method for annealing a lithium tantalate (LiTaO$_3$) structure, the method comprising:
locating a lithium tantalate powder in a space proximate to the lithium tantalate structure to retard outgassing of lithium oxide (Li$_2$O) from the lithium tantalate structure;
separating the space including the lithium tantalate powder from the lithium tantalate structure with an interface porous to lithium oxide gas outgassed from the lithium tantalate powder and the interface substantially without porosity to the lithium tantalate powder;
heating the lithium tantalate structure and the lithium tantalate powder in a sealed oxygen gas (O$_2$) atmosphere;
pressurizing the sealed oxygen gas atmosphere to a pressure above ambient atmospheric pressure;
maintaining temperature and pressure for an anneal period; and
cooling to room temperature.

37. The method of claim 36 wherein the interface includes a porosity of approximately 20 microns.

38. The method of claim 36 wherein the sealed oxygen gas atmosphere substantially lacks in H$_2$O.

39. The method of claim 36 wherein said heating occurs at a rate within the range of about 0.5 degrees Celsius per minute to about 12.0 degrees per minute.

40. The method of claim 36 wherein said pressurizing is within a pressure range of about 2 psi above ambient atmospheric pressure to about 25 psi above ambient atmospheric pressure.

41. The method of claim 36 wherein said cooling occurs within a range of rates of about 0.5 degrees Celsius per minute to about 40 degrees Celsius per minute.

42. The method of claim 36 wherein the lithium tantalate structure includes at least one of an optical modulator and an optical waveguide.

43. The method of claim 36 wherein the sealed oxygen gas atmosphere is a pure oxygen gas atmosphere.

44. The method of claim 36 wherein said heating is within a temperature range of about 150 degrees Celsius to about 900 degrees Celsius.

45. The method of claim 44 wherein said heating is within a temperature range of about 150 degrees Celsius to about 600 degrees Celsius.

46. The method of claim 45 wherein said heating is within a temperature range of about 300 degrees Celsius to about 400 degrees Celsius.

47. A method for annealing a lithium niobate (LiNbO$_3$) structure, the method comprising:
heating the lithium niobate structure in a sealed oxygen gas (O$_2$) atmosphere substantially lacking in H$_2$O, without introducing substantial quantities of undesirable free protons into the lithium niobate structure, the lithium niobate structure being heated to within a temperature range from about 150 degrees Celsius and less than 400 degrees Celsius;
pressurizing the sealed oxygen gas atmosphere to exceed ambient atmospheric pressure;
maintaining temperature and pressure for an anneal period; and cooling to room temperature.

48. The method of claim 47 wherein said heating is within a temperature range from about 300 degrees Celsius and less than 400 degrees Celsius.

49. The method of claim 47 wherein said heating is performed at a temperature about 300 degrees Celsius.

50. The method of claim 47 wherein the sealed oxygen gas atmosphere is a pure oxygen gas atmosphere.

51. A method for annealing a lithium tantalate (LiTaO$_3$) structure, the method comprising:
heating a lithium tantalate structure in a sealed oxygen gas (O$_2$) atmosphere substantially lacking in H$_2$O, without introducing substantial quantities of undesirable free protons into the lithium tantalate structure, the lithium tantalate structure being heated to a temperature range from about 150 degrees Celsius and less than 400 degrees Celsius;
pressurizing the sealed oxygen gas atmosphere to exceed ambient atmospheric pressure;
maintaining temperature and pressure for an anneal period; and
cooling to room temperature.

52. The method of claim 51 wherein said heating is within a temperature range from about 300 degrees Celsius and less than 400 degrees Celsius.

53. The method of claim 51 wherein said heating is performed at a temperature about 300 degrees Celsius.

54. The method of claim 51 wherein the sealed oxygen gas atmosphere is a pure oxygen gas atmosphere.

* * * * *

UNITED STATES PATENT AND TRADEMARK OFFICE
CERTIFICATE OF CORRECTION

| | |
|---|---|
| PATENT NO. | : 6,770,132 B1 |
| APPLICATION NO. | : 09/309361 |
| DATED | : August 3, 2004 |
| INVENTOR(S) | : Burrows |

It is certified that error appears in the above-identified patent and that said Letters Patent is hereby corrected as shown below:

In section 56 of the cover page by US patent 4,196,963 remove the "*"

In section 57 of the cover page, after "ramp down rate.", insert --In another aspect of the invention a lithium niobate structure such as an optical waveguide or an optical modulator comprises an optically transparent portion that is substantially void of free protons.--

Signed and Sealed this

Second Day of October, 2007

JON W. DUDAS
*Director of the United States Patent and Trademark Office*